United States Patent
Wu (10) Patent No.: US 8,283,986 B2
(45) Date of Patent: Oct. 9, 2012

(54) METHOD AND SYSTEM FOR REDUCED CLOCK FEED-THROUGH IN A PHASE LOCKED LOOP

(75) Inventor: Stephen Wu, Fountain Valley, CA (US)

(73) Assignee: Broadcom Corporation, Irvine, CA (US)

( * ) Notice: Subject to any disclaimer, the term of this patent is extended or adjusted under 35 U.S.C. 154(b) by 250 days.

(21) Appl. No.: 12/353,955

(22) Filed: Jan. 14, 2009

(65) Prior Publication Data
US 2010/0176887 A1 Jul. 15, 2010

(51) Int. Cl.
*H03L 7/00* (2006.01)
(52) U.S. Cl. .................. 331/17; 331/16; 331/34
(58) Field of Classification Search ............ 331/16, 331/17, 34, 175, 179, 182, 185, 186; 327/157
See application file for complete search history.

(56) References Cited

U.S. PATENT DOCUMENTS

| | | | | |
|---|---|---|---|---|
| 4,651,037 | A * | 3/1987 | Ogasawara et al. ........... 327/389 |
| 5,920,233 | A * | 7/1999 | Denny ............................. 331/14 |
| 6,114,888 | A * | 9/2000 | Walley ........................... 327/157 |
| 6,223,061 | B1 * | 4/2001 | Dacus et al. ................... 455/574 |
| 6,774,731 | B2 * | 8/2004 | Magazzu et al. ................. 331/17 |
| 7,038,509 | B1 * | 5/2006 | Zhang ............................ 327/157 |
| 7,248,123 | B2 * | 7/2007 | Horan .............................. 331/16 |
| 7,339,415 | B2 * | 3/2008 | Gaggl et al. ................... 327/537 |
| 2005/0035797 | A1 * | 2/2005 | Frans et al. .................... 327/156 |
| 2005/0195002 | A1 * | 9/2005 | Puccio et al. .................. 327/157 |
| 2007/0041246 | A1 * | 2/2007 | Smith et al. .............. 365/185.08 |
| 2008/0136536 | A1 * | 6/2008 | Anand ............................. 331/17 |

* cited by examiner

*Primary Examiner* — Joseph Chang
*Assistant Examiner* — Jeffrey Shin
(74) *Attorney, Agent, or Firm* — Thomas, Kayden, Horstemeyer & Risley, LLP (57) ABSTRACT

Aspects of a method and system for reduced clock feed-through in a phase locked loop are provided. In this regard, a control voltage for controlling a VCO may be generated via a filter comprising at least one switching element clocked via a clock booster circuit and comprising one or more thick oxide transistors to reduce clock feed-through. A first switching element of the filter may be a first transmission gate comprising thick oxide transistors. The first transmission gate may be part of a sample and hold circuit. A DC voltage on an input node of the sample and hold circuit may be periodically reset via a reset switching element, which may comprise thick oxide transistors. The reset switching element may be controlled via a clock booster circuit. The filter may also comprise a buffer having an input stage comprising one or more thick oxide transistors.

28 Claims, 6 Drawing Sheets

FIG. 4

METHOD AND SYSTEM FOR REDUCED CLOCK FEED-THROUGH IN A PHASE LOCKED LOOP

CROSS-REFERENCE TO RELATED APPLICATIONS/INCORPORATION BY REFERENCE

Not Applicable

FIELD OF THE INVENTION

Certain embodiments of the invention relate to signal processing. More specifically, certain embodiments of the invention relate to a method and system for reduced clock feed-through in a phase locked loop.

BACKGROUND OF THE INVENTION

A circuit that generates a signal for which an oscillating frequency of the signal is proportional to an applied voltage may be referred to as a voltage controlled oscillator (VCO). The value of the VCO gain, Kvco, may control the amount by which the oscillating frequency of a time-varying signal generated by a VCO may change based on a change in the voltage level of a control signal.

VCOs may be used in a wide variety of applications and they may be a main building block of Phase-Locked Loops (PLLs). PLLs are electronic feedback circuits that may be used to track, for example, the frequency changes in an FM modulated signal and may be used as demodulator and a variety of other applications in communication systems. Additionally, PLLs may comprise a loop filter which may smooth adjustments of the VCO control voltage in order to generate a signal with a more stable frequency and less noise and/or spurs.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for reduced clock feed-through in a phase locked loop, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for reduced clock feed-through in a phase locked loop. In various exemplary embodiments of the invention, a control voltage for controlling a voltage controlled oscillator (VCO) may be generated via a filter comprising at least one switching element clocked via a clock booster circuit and comprising one or more thick oxide transistors to reduce clock feed-through. The frequency of a signal output by the VCO may thus be controlled by the generated control voltage. A first switching element of the filter may be a first transmission gate comprising an N-type thick oxide transistor and a P-type thick oxide transistor. The first transmission gate may be part of a sample and hold circuit, where a first terminal of the first transmission gate may be communicatively coupled to a first capacitor and a second terminal of the first transmission gate may be communicatively coupled to a second capacitor. A voltage at an input of the sample and hold circuit may be adjusted via a charge pump. The output of the sample and hold may be buffered to generate the VCO control voltage. An input stage of the buffer may comprise one or more thick oxide transistors. One or both of the capacitances of the sample and hold circuit may be controlled to adjust a time constant of the circuit. A DC voltage on an input node of the sample and hold circuit may be periodically reset via a reset switching element, which may be a second transmission gate comprising an N-type thick oxide transistor and a P-type thick oxide transistor. In this regard, the reset switching element may be communicatively coupled to an input node of the sample and hold circuit and to a reset voltage. The reset switching element may be controlled via a clock booster circuit.

Figure 1A:
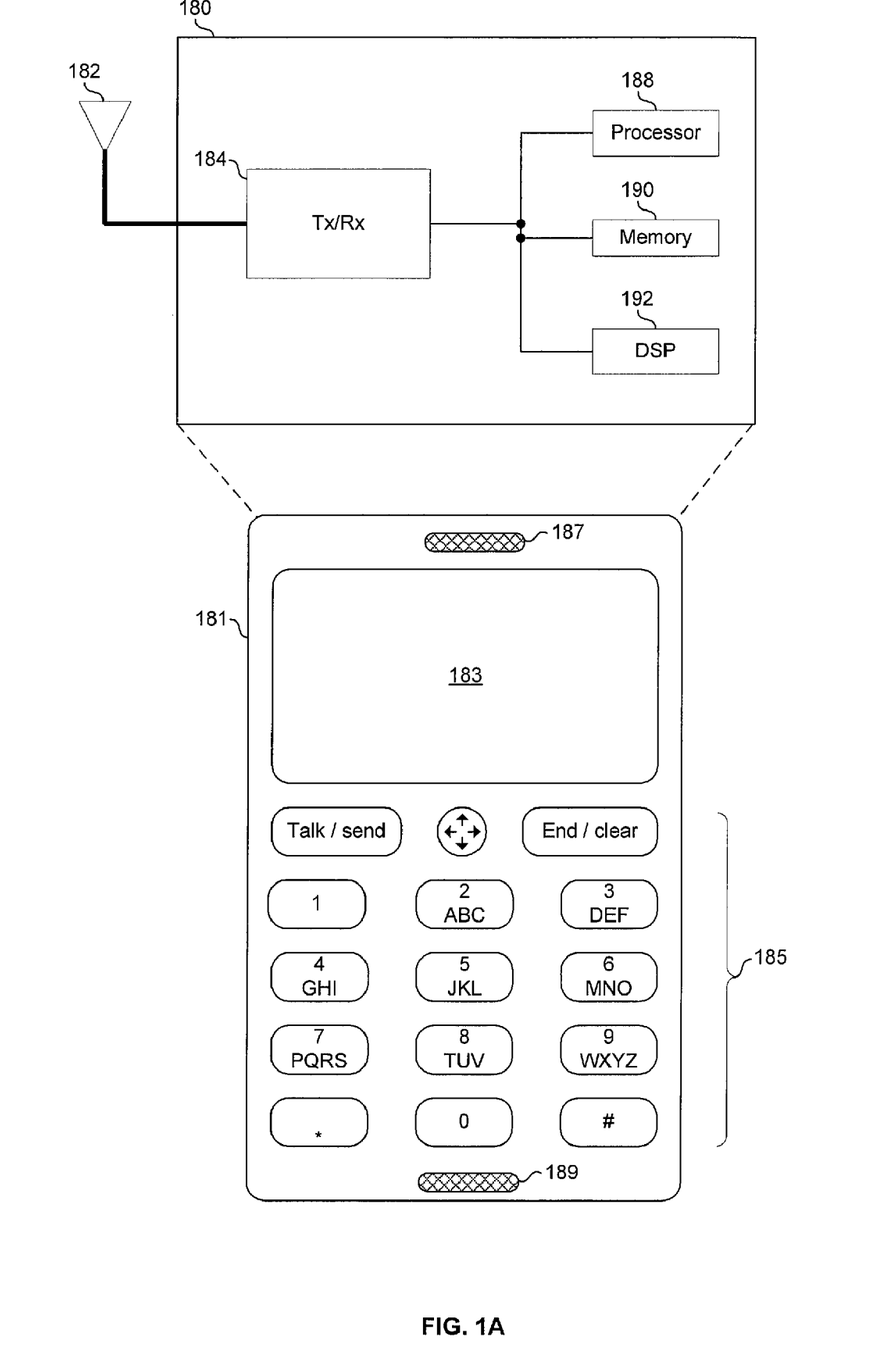
FIG. 1A is a block diagram of an exemplary communication device comprising one or more phase locked loops, in accordance with an embodiment of the invention.

FIG. 1A is a block diagram of an exemplary communication device comprising one or more phase locked loops, in accordance with an embodiment of the invention. The communication device 180 may comprise an antenna 182, a transmitter and/or receiver (Tx/Rx) 184, a processor 188, a memory 190, a digital signal processor (DSP) 192, a display 183, user controls 185, a speaker 187, and a microphone 189.

The antenna 182 may be suitable for transmitting and/or receiving electromagnetic signals. Although a single antenna is illustrated, the invention is not so limited. In this regard, the Tx/Rx 184 may utilize a common antenna for transmission and reception of signals adhering to one or more wireless standards, may utilize different antennas for each supported wireless standard, and/or may utilize a plurality of antennas for each supported wireless standard.

The Tx/Rx 184 may comprise suitable logic circuitry and/or code that may be operable to transmit and/or receive data utilizing one or more wired, wireless, and/or optical standards. In various exemplary embodiments of the invention, the Tx/Rx 184 may be operable to communicate in adherence with cellular, Worldwide Interoperability for Microwave Access (WiMAX), Wi-Fi, Bluetooth, Zigbee, T1/E1, Ethernet, Universal Serial Bus, IEEE 1394, analog audio standards, analog video standards, digital audio standards, and/or digital video standards. The Tx/Rx 184 may be operable to perform amplification, down-conversion, filtering, demodulation, and analog to digital conversion of received signals. The Tx/Rx 184 may be operable to perform amplification, up-conversion, filtering, modulation, and digital to analog conversion of signals to be transmitted.

The processor 188 may comprise suitable logic, circuitry, and/or code that may enable processing data and/or controlling operations of the communication device 180. In this regard, the processor 188 may be enabled to provide control signals to the various other portions comprising the communication device 180. The processor 188 may also control transfers of data between various portions of the communication device 180. Additionally, the processor 188 may enable execution of applications programs and/or code for processing data and effectuating operation of the communication device 180.

The memory 190 may comprise suitable logic, circuitry, and/or code that may enable storage or programming of information comprising parameters and/or code that may effectuate the operation of the communication device 180. Stored information may comprise received data and/or data to be presented, transmitted, and/or otherwise processed. The parameters may comprise configuration data and the code may comprise operational code such as software and/or firmware, but the information need not be limited in this regard.

The DSP 192 may comprise suitable logic, circuitry, and/or code operable to perform computationally intensive processing of data. In various embodiments of the invention, the DSP 192 may encode, decode, transcode, modulate, demodulate, encrypt, decrypt, scramble, descramble, and/or otherwise process data.

The display 183 may be operable to provide visual information to, and/or enable interaction by, a user of the communication device 180. In various embodiments of the invention, a graphical user interface may be presented via the display 183. In various embodiments of the invention, a visual media content such as video, images, and text may be presented via the display 183.

The user controls 185 may be operable to enable user interaction with the communication device 180 to control services and/or content handled by the communication device 180. The user controls 185 may comprise, for example, a keypad, a keyboard, a roller ball, a multidirectional button, a scroll wheels, and/or a touch screen.

The speaker 187 may be operable to present audio information to a user. The speaker may present voice from a phone call and/or music or ringtones played back by the cellular enabled communication device.

The microphone 189 may be operable to convert acoustic signals into electronic signals. The microphone may enable a user to participate in a phone call and/or interact with the cellular enabled communication device via oral input.

In operation, the Tx/Rx 184 may receive data formatted according to one or more communication standards, process the data, and output digital baseband data to the processor 188, the memory 190, and/or the DSP 192. The digital baseband data may be processed by the processor 188, the memory 190, and/or the DSP 192 to effectuate operation of the communication device 180 and/or for presentation of content to a user of the communication device 180.

Figure 1B:
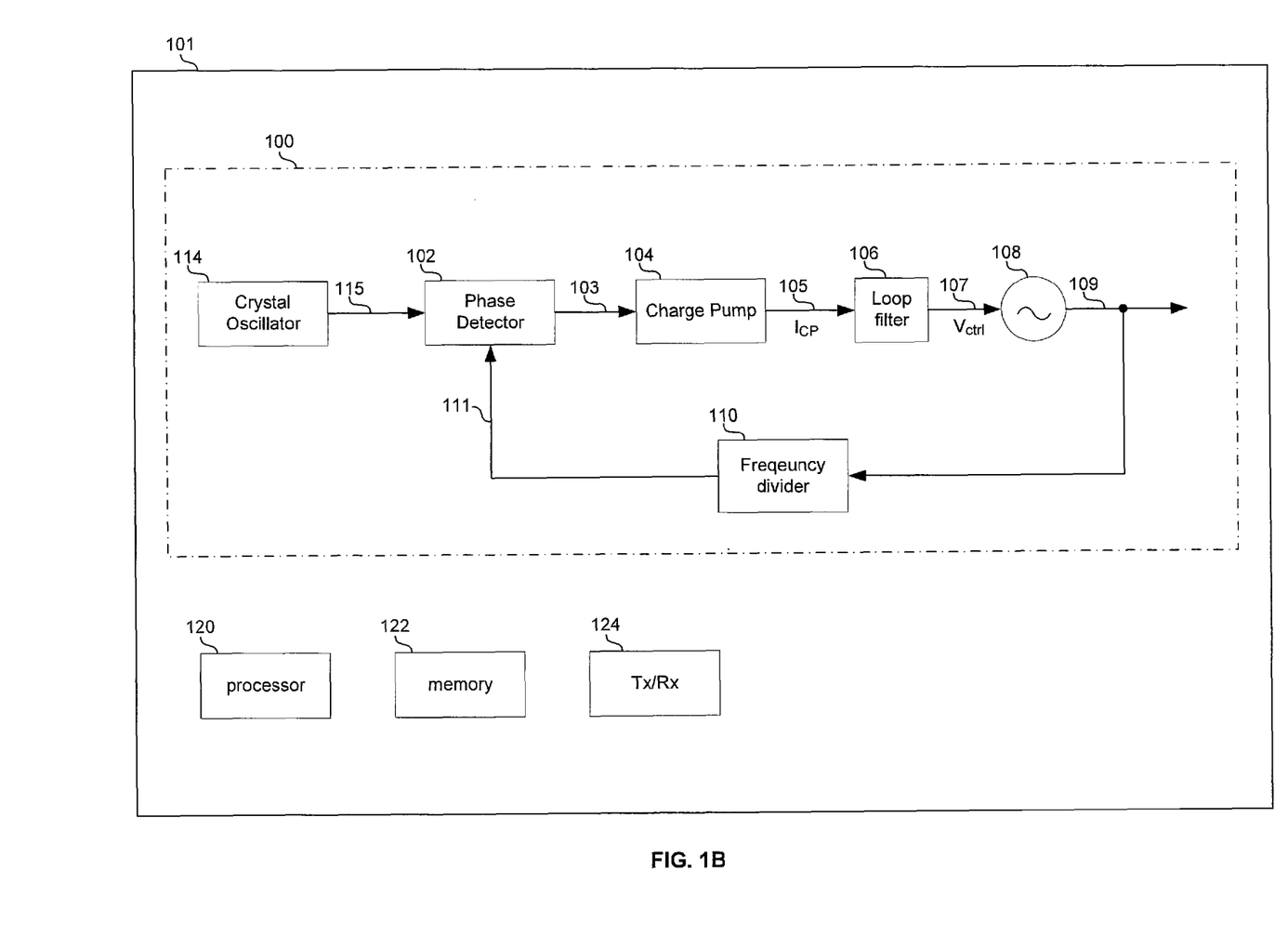
FIG. 1B is a block diagram of an electronic device comprising an exemplary PLL, in accordance with an embodiment of the invention.

FIG. 1B is a block diagram of an electronic device comprising an exemplary PLL, in accordance with an embodiment of the invention. Referring to FIG. 1B the electronic device 101 may comprise a processor 120, a memory 122, a transmitter and/or receiver 124, and an exemplary phase locked loop (PLL) 100. The exemplary PLL 100 may comprise a crystal oscillator 114, a phase detector 102, a charge pump 104, a loop filter 106, a voltage controlled oscillator (VCO) 108, and a frequency divider 110.

The crystal oscillator 114 may comprise suitable logic, circuitry, and/or code that may enable generating a stable reference frequency signal 115.

The phase detector 102 may comprise suitable logic, circuitry, and/or code that may enable generating one or more signals based on a phase difference between two signals.

The charge pump 104 may comprise suitable logic, circuitry, and/or code that may enable sinking or sourcing a current ($I_{CP}$) 105 of the VCO 108 based on the error signal 103.

The loop filter 106 may comprise suitable logic, circuitry, and/or code that may be operable to convert the current 105 output of the charge pump into a control voltage 107.

The VCO 108 may comprise suitable logic, circuitry, and/or code that may enable generating a signal 109 based on a control voltage (Vctrl) 107. In this regard, the frequency of the signal 109 may be determined, at least in part, by the control voltage 107.

The frequency divider 110 may comprise suitable logic, circuitry, and/or code for receiving the signal 109 having a first, higher, frequency and outputting a feedback signal 111 having a second, lower, frequency. The frequency divider 110 may be an integer and/or fractional divider and the divide ratio may be determined based on the frequency of the output signal 109 and the frequency of the reference signal 115.

The processor 120 may comprise suitable logic, circuitry, and/or code that may enable processing data and/or controlling operations of the electronic device 101. With regard to controlling operations of the electronic device 101, the processor 120 may be enabled to provide control signals to the PLL 100, the memory 122, and/or the transmitter and/or receiver 124. The processor 120 may also control data transfers between the PLL 100, the memory 122, and/or the transmitter and/or receiver 124. Additionally, the processor 120 may enable execution of applications programs and/or code.

The memory 122 may comprise suitable logic, circuitry, and/or code that may enable storage or programming of information that includes parameters and/or code that may effectuate the operation of the electronic device 101. The parameters may comprise configuration data and the code may comprise operational code such as software and/or firmware, but the information need not be limited in this regard. Additionally, the memory 122 may buffer or otherwise store received data and/or data to be transmitted. In various embodiments of the invention, the memory 122 may comprise one or more look-up tables or other data structures which may comprise information for controlling operation of the electronic device 101. For example, the memory 122 may store a look-up table for programming the frequency divider 110.

The transmitter and/or receiver (Tx/Rx) 124 may comprise suitable logic, circuitry, and/or code that may be operable to communicate over one or more wired, optical, and/or wireless mediums. In various exemplary embodiments of the invention, the Tx/Rx 124 may be operable to communicate in adherence with cellular, Wi-Fi, Bluetooth, Zigbee, T1/E1, Ethernet, USB, IEEE 1394, and/or High-Definition Multimedia Interface (HDMI) standards. The transmitter and/or receiver may utilize the signal 109 as a carrier frequency and/or reference frequency for transmitting and/or receiving data.

In operation the PLL 100 may generate a signal 109 of variable frequency that has the stability of the fixed frequency reference signal 115 from the crystal oscillator 114. The signals 111 and 115 may be input to the phase detector 102 and the error signal 103 may be output. The error signal 103 may be based on a phase difference between the signals 111 and 115. In this regard, the average voltage of the error signal 103 may be proportional to the phase difference between the signals 111 and 115. In instances where the error signal 103 indicates that feedback signal 111 is phase lagging the reference signal 115, the charge pump 104 may drive current into the loop filter 106. In instances that the error signal 103 indicates that feedback signal 111 is phase leading the reference signal 115, the charge pump 104 may draw current from the loop filter 106.

The loop filter 106 may convert the current from the charge pump into the control voltage 107. The loop filter 106 may have a low pass frequency characteristic which may filter out noise or jitter and may prevent the control voltage 107 from over shooting which could lead to instability in the PLL and/or undesirable frequency fluctuations in the frequency of the output signal 109. In various embodiments of the invention, the loop filter 106 may comprise one or more switching elements that may, for example, be utilized to implement a sample and hold circuit along with one or more capacitors and/or to implement a reset function. In various embodiments of the invention, the switching elements may comprise thick oxide transistors and may be clocked via a clock-booster circuit.

Figure 2A:
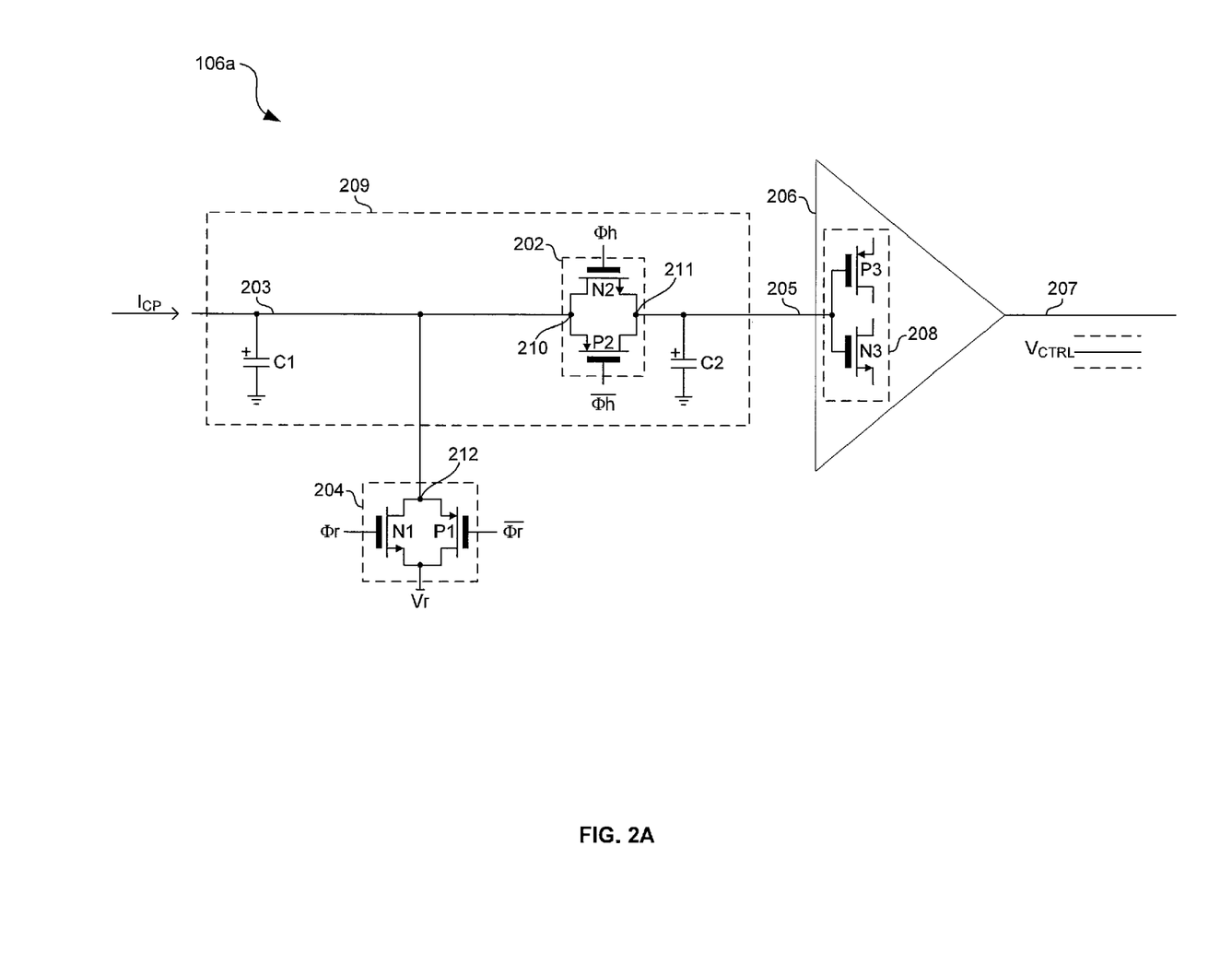
FIG. 2A is a diagram of an exemplary PLL loop filter comprising a sample and hold circuit and a reset switching element, in accordance with an embodiment of the invention.

FIG. 2A is a diagram of an exemplary PLL loop filter comprising a sample and hold circuit and a reset switching element, in accordance with an embodiment of the invention. Referring to FIG. 2A, the loop filter 106a may comprise capacitors C1 and C2, switching elements 202 and 204, and buffer 206.

The loop filter 106a may be as described with respect to FIG. 1.

The capacitors C1 and C2 may be realized utilizing any known techniques for on-chip capacitors. The capacitance of the capacitors may be determined based a desired frequency response of the filter 106a.

The switching element 202 may be a transmission gate comprising a thick-oxide N-type transistor N2 and a thick-oxide P-type transistor P2. In this regard, the gate oxide of the transistors N2 and P2 may be thicker than the gate oxide for core transistors fabricated in the same process. For example, for a 65 nm process, a core device may have a gate oxide thickness of approximately 30 angstroms and a thick oxide transistor may have a gate oxide thickness of approximately 2 times that, or 60 angstroms. The switching element 202 may be controlled via the sampling clock Φh which may be driven by a clock booster circuit such as the clock booster circuit 300 described below with respect to FIG. 3. In this regard, when Φh is equal, within a tolerance, to 2*Vdd, the switching element 202 may conduct current between the node 203 and the node 205. Conversely, when Φh is equal, within a tolerance, to Gnd, the node 203 may be electrically isolated from node 205. The thick gate oxide may enable the transistors N2 and P2 to withstand the higher voltage output by the clock booster circuit. Additionally, the thick oxide of the transistors N2 and P2 may reduce the amount of clock feed-through from the gates of N2 and P2 to the nodes 203 and 205, ultimately resulting in a less noisy control voltage 107 on the output node 207 of the filter 106a.

The switching element 204 may be a transmission gate comprising a thick-oxide N-type transistor N1 and a thick-oxide P-type transistor P1. In this regard, the gate oxide of the transistors N1 and P1 may be thicker than the gate oxide for core transistors fabricated in the same process. For example, for a 30 angstroms core device thickness, a thick oxide transistor may have a gate oxide thickness of approximately 2 times that, or 60 angstroms. The switching element 204 may be controlled via the reset clock Φr which may be driven by a clock booster circuit such as the clock booster circuit 300 described below with respect to FIG. 3. In this regard, when Φr is equal, within a tolerance, to 2*Vdd, the switching element 204 may conduct current between the node 203 and the reset voltage Vr. Conversely, when Φr is equal, within a tolerance, to Gnd, the node 203 may be electrically isolated from Vr. The thick gate oxide may enable the transistors N1 and P1 to withstand the higher voltage output by the clock booster circuit. Additionally, the thick oxide of the transistors N1 and P1 may reduce the amount of clock feed through from the gates of N1 and P1 to the node 203, ultimately resulting in a less noisy control voltage 107 at the output node 207 of the filter 106a.

The buffer 206 may be a unity gain buffer. In this regard, the control voltage 107 on the node 207 may be equal, within a tolerance, to the voltage on the node 205. An Input stage 208 of the buffer 206 may comprise thick oxide transistors such that the buffer 206 has a high input impedance and low input leakage current. The exemplary input stage 208 depicted comprises a thick oxide N-type transistor N3 and a thick oxide P-type transistor P3, however, the invention is not limited in regard to the number of transistors in and/or the configuration of the input stage 208, so long as thick oxide transistors are utilized.

A typical N-type thick oxide transistor is a transistor with n-type source and drain regions created in a p-type substrate. Applying a bias voltage to the gate of the N-type thick oxide transistor induces an N-type channel between the two regions. The gate is separated from the channel via a thick layer of silicon dioxide, hence the term "thick oxide."

A typical P-type thick oxide transistor is a transistor with p-type source and drain regions created in an N-type well that is created in a P-type substrate. Applying a bias voltage to the gate of the N-type thick oxide transistor induces an N-type channel between the two regions. The gate is separated from the channel via a thick layer of silicon dioxide, hence "thick oxide."

In operation, the capacitor C1 may be charged or discharged based on whether the charge pump 104 (FIG. 1) is sourcing or sinking current. When the Φh goes high, the voltage on C1 may be transferred to C2 and when Φh goes low the sampled voltage may be held on capacitor C2. In this regard, because of the finite on-resistance of the switching element 202, $R_{on}$, the voltage on C2 may ramp-up or ramp-down due to the time constant $R_{on}*C2$. Accordingly, the voltage on the node 205 may be smoothed compared to the voltage on the node 203. In this manner, noise or other high frequency signals on the node 203 may be filtered out. The voltage on the node 205 may be replicated as the control voltage 107 at the output node 207 of the filter 106a. In this regard, the buffer 206 may provide a high input resistance and low input leakage current which may reduce spurs on the node 207.

Figure 2B:
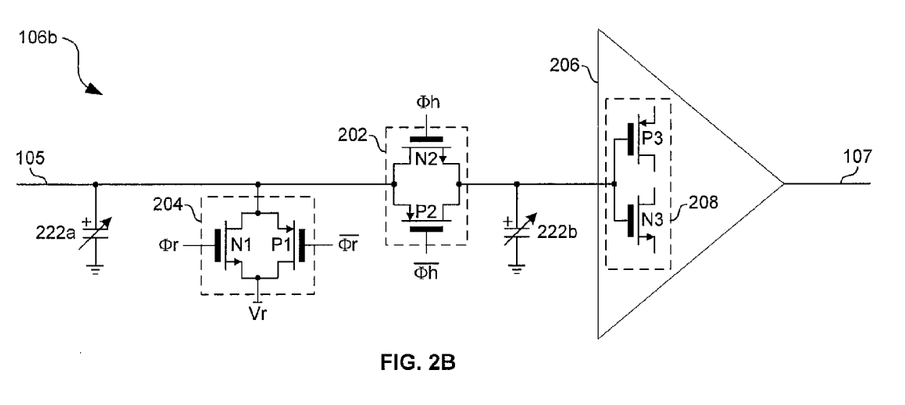
FIG. 2B is a diagram of an exemplary PLL loop filter comprising a sample and hold circuit and a reset switching element, in accordance with an embodiment of the invention.

FIG. 2B is a diagram of an exemplary tunable PLL loop filter comprising a sample and hold circuit and a reset switching element, in accordance with an embodiment of the invention. Referring to FIG. 2B, the loop filter 106b may be similar to the loop filter 106a described with respect to FIG. 2A, but may differ in that the capacitors C1 and C2 of filter 106a may be replaced by tunable capacitances 222a and 222b in the filter 106b.

In operation, the capacitances 222a and 222b may be tuned to adjust the frequency response of the loop filter 106b. In this regard, the capacitances may be adjusted via one or more control signals from a processor, such as the processor 120 described with respect to FIG. 1A. In various exemplary embodiments of the invention, the tunable capacitances 222a and 222b may comprise varactors controlled via one or more analog voltages and/or switchable banks of capacitors, such as the capacitor bank 230 described below with respect to FIG. 2C, tunable via one or more digital control words.

Figure 2C:
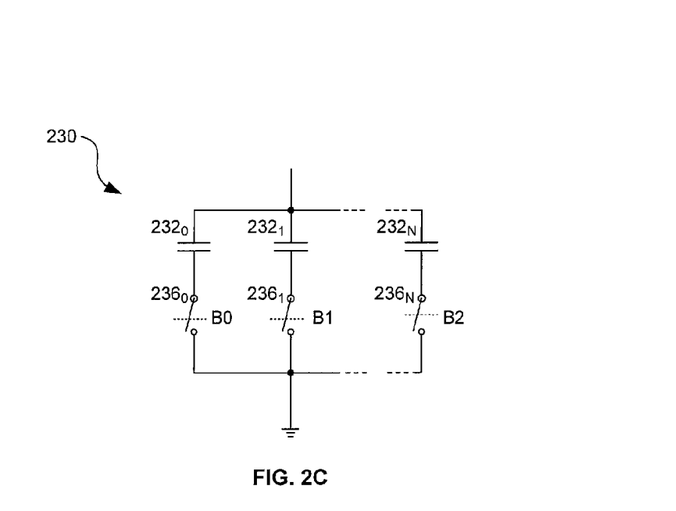
FIG. 2C is a diagram of an exemplary switchable capacitor bank, in accordance with an embodiment of the invention.

FIG. 2C is a diagram of an exemplary switchable capacitor bank, in accordance with an embodiment of the invention. Referring to FIG. 2C, the capacitor bank 230 may comprise a plurality of capacitors $232_0, 232_1, \ldots, 232_N$ and a corresponding plurality of switching elements $236_0, 236_1, \ldots, 236_N$. Each of the N+1 capacitors may, for example, be of unit capacitance, or the capacitance values may be binary weighted. The N+1 switching elements may be controlled via a N+1 bit digital signal, which may be generated by, for example, the processor 120 described with respect to FIG. 1.

In operation, a capacitor $232_i$ may contribute to the overall capacitance of the capacitor bank 230 when the switching element $236_i$ is closed, where i is an integer between 0 and N. In the exemplary embodiment of the invention depicted in FIG. 2C, B is a three bit signal with bits 0, 1, and 2 controlling switching elements $236_0, 236_1, 236_2$, respectively. Accordingly, there are 8 possible configurations of the switching elements $236_0, 236_1, 236_2$ and thus 8 possible capacitance values, including zero when all switching elements are open.

Figure 3:
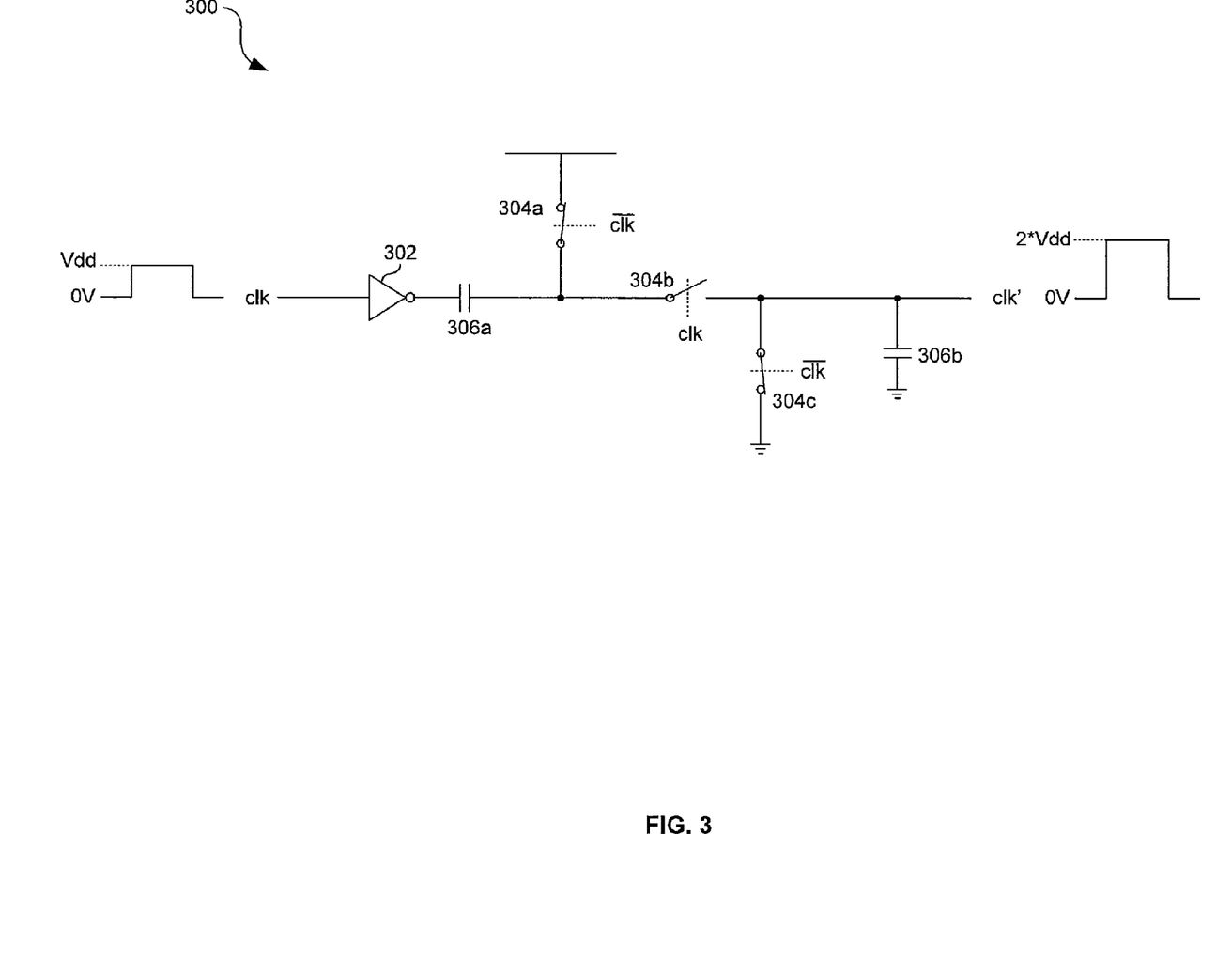
FIG. 3 is a diagram of an exemplary clock booster circuit, in connection with an embodiment of the invention.

FIG. 3 is a diagram of an exemplary clock booster circuit, in connection with an embodiment of the invention. Referring to FIG. 3, there is shown a clock booster circuit comprising an inverter 302, switching elements 304a-304c, and capacitors 306a and 306b.

The inverter 302 may comprise suitable logic, circuitry, and/or code that may be operable to invert the clk signal input to the clk booster circuit.

The switching elements 304a and 304c may comprise suitable logic, circuitry and/or code that may be operable to open when clk is equal to, within a tolerance, the supply voltage Vdd and may be closed when clk is equal to, within a tolerance, Gnd.

The switching element 304b may comprise suitable logic, circuitry and/or code that may be operable to open when clk is equal to, within a tolerance, Gnd and may be closed when clk is equal to, within a tolerance, the supply voltage Vdd.

The capacitor 306a may be realized utilizing any known techniques for on-chip capacitors. The capacitor 306b may be an input capacitance of the circuit being driven by the clock booster circuit 300. For example, the capacitor 306b may be the gate capacitance of one of the transistors N1, P1, N2, or P2 described with respect to FIGS. 2A and 2B.

In operation, the clk signal input to the clock booster circuit 300 may have levels of Gnd and Vdd and the signal clk' output by the clock booster circuit 300 may have levels of Gnd and 2*Vdd.

Figure 4:
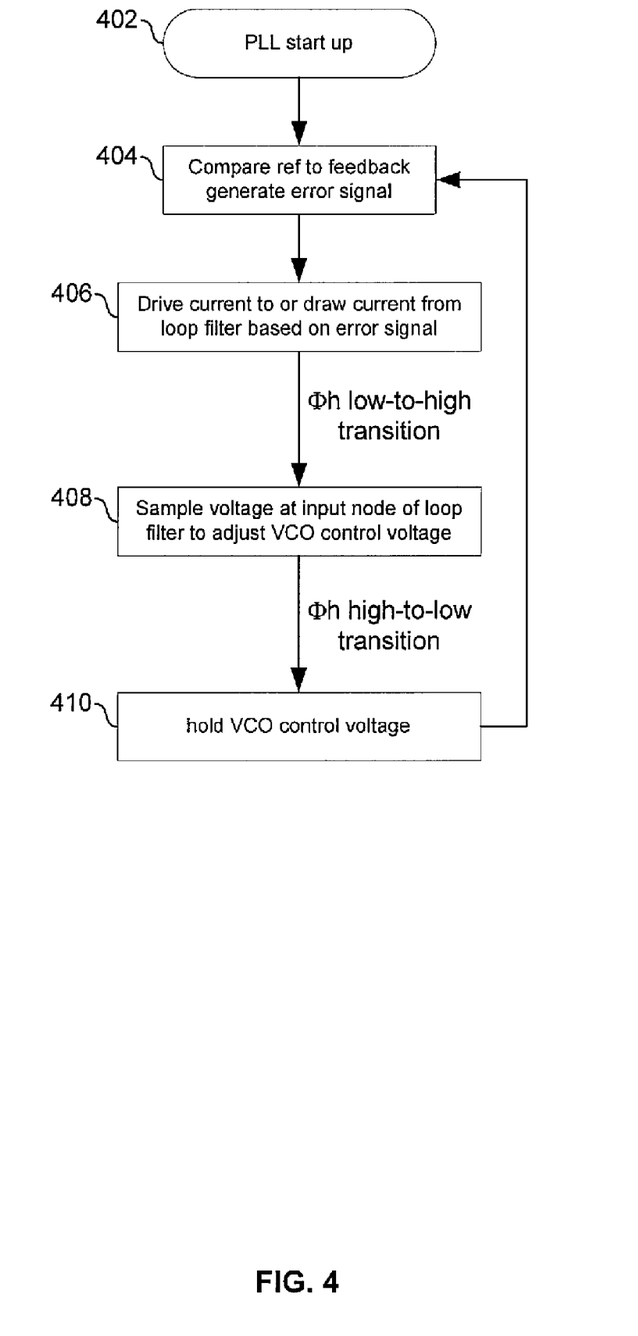
FIG. 4 is a flow chart illustrating exemplary steps for generating an oscillator control voltage, in accordance with an embodiment of the invention.

FIG. 4 is a flow chart illustrating exemplary steps for generating an oscillator control voltage, in accordance with an embodiment of the invention. The exemplary steps are described with reference to the PLL 100 described with respect to FIG. 1 and the loop filter 106a described with respect to FIG. 2A. Referring to FIG. 4, the exemplary steps may begin with step 402 when the PLL 100 may start-up and attempt to achieve phase lock. Subsequent to step 402, the exemplary steps may advance to step 404.

In step 404, the reference signal 115 may be compared to the feedback signal 111. The phase detector may adjust the value of the error signal 103 to reflect the phase difference between the reference signal 115 and the feedback signal 111. Subsequent to step 404, the exemplary steps may advance to step 406.

In step 406, the charge pump 104 may drive current into, or draw current from, the loop filter 106, based on the error signal. For example, in instances that the error signal 103 indicates that the feedback signal 111 is phase lagging the reference signal 115, the charge pump 104 may drive current into node 203 of the loop filter 106a. In this regard, positive charge may be placed on the positive terminal capacitor C1. Conversely, in instances that the error signal 103 indicates that the feedback signal 111 is phase leading the reference signal 115, the charge pump 104 may draw current from node 203 of the loop filter 106a. In this regard, positive charge may be pulled off of the positive terminal of the capacitor C1. When the sample clock Φh transitions to within a tolerance of 2*Vdd, the exemplary steps may advance to step 408.

In step 408, while the switching element 204 is conducting, charge may be redistributed between the capacitors C1 and C2 and thus the voltage of node 205 may be increased or decreased based on the voltage on node 203. The control voltage 107 at the output node 207 of the buffer 206 may adjust correspondingly. When Φh transitions to within a tolerance of Gnd, the exemplary steps may advance to step 410.

In step 410, voltage on the node 205 may be held constant until the next low to high transition of Φh. In this regard, the low input leakage current of the buffer 206 may minimize the discharging of the capacitor C2 during the hold phase, resulting in a more stable control voltage 107 on the node 207. Subsequent to step 410, the exemplary steps may return to step 404. In some embodiments of the invention, subsequent to step 410 and prior to returning to step 404, the switching element 204 may be closed to reset the voltage at the node 203.

Various aspects of a method and system for reduced clock feed-through in a phase locked loop are provided. In an exemplary embodiment of the invention, a control voltage 107 for controlling a voltage controlled oscillator (VCO) 108 may be generated via a filter 106a comprising at least one switching element clocked via a clock booster circuit 300 and comprising one or more thick oxide transistors N2 and P2 to reduce clock feed-through. The frequency of a signal 109 output by the VCO 108 may thus be controlled by the generated control voltage 107. A first switching element of the filter 106a may be a first transmission gate 202 comprising an N-type thick oxide transistor N2 and a P-type thick oxide transistor P2. The first transmission gate 202 may be part of a sample and hold circuit 208, where a first terminal 210 of the first transmission gate 202 may be communicatively coupled to a first capacitor C1, and a second terminal 211 of the first transmission gate 202 may be communicatively coupled to a second capacitor C2. A voltage at an input 203 of the sample and hold circuit 208 may be adjusted via a charge pump 104.

The output 205 of the sample and hold circuit 209 may be buffered to generate the VCO control voltage 107. An input stage 208 of the buffer 206 may comprise one or more thick oxide transistors N3 and P3. One or both of the capacitances C1 and C2 of the sample and hold circuit 209 may be controlled to adjust a time constant of the circuit. A DC voltage on an input node 203 of the sample and hold circuit 208 may be periodically reset via a reset switching element 204 which may be a second transmission gate comprising an N-type thick oxide transistor N1 and a P-type thick oxide transistor P1. In this regard, the reset switching element 204 may be communicatively coupled to an input node 203 of the sample and hold circuit 209 and to a reset voltage Vr. The reset switching element 204 may be controlled via a clock booster circuit such as the clock booster 300.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for reduced clock feed-through in a phase locked loop.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
generating, via a filter, a control voltage for controlling a voltage controlled oscillator, wherein:
said filter comprises a first transmission gate and a second transmission gate, said first transmission gate being clocked via a clock booster circuit, said second transmission gate being operable to reset at least a portion of said filter; and
each of said first transmission gate and said second transmission gate comprises one or more thick oxide transistors to reduce clock feed-through; and
controlling said voltage controlled oscillator utilizing said generated control voltage.

2. The method according to claim 1, wherein said first transmission gate comprises an N-type thick oxide transistor and a P-type thick oxide transistor.

3. The method according to claim 2, wherein said first transmission gate is part of a sample and hold circuit, where a first terminal of said first transmission gate is communicatively coupled to a first capacitor and a second terminal of said first transmission gate is communicatively coupled to a second capacitor.

4. The method according to claim 3, comprising adjusting a voltage at an input node of said sample and hold circuit via a charge pump.

5. The method according to claim 3, comprising buffering an output of said sample and hold circuit to generate said control voltage.

6. The method according to claim 5, wherein an input stage of a buffer utilized for said buffering comprises one or more thick oxide transistors.

7. The method according to claim 3, comprising controlling a capacitance of one or both of said first capacitor and said second capacitor such that that a time constant of said sample and hold circuit is within desired limits.

8. The method according to claim 3, comprising periodically resetting a DC voltage on an input node of said sample and hold circuit via said second transmission gate.

9. The method according to claim 8, wherein said second transmission gate comprises an N-type thick oxide transistor and a P-type thick oxide transistor.

10. The method according to claim 9, wherein a first terminal of said second transmission gate is communicatively coupled to an input of said sample and hold circuit and a second terminal of said second transmission gate is communicatively coupled to a DC voltage.

11. The method according to claim 9, comprising clocking said second transmission gate via said clock booster circuit.

12. A system for signal processing, the system comprising:
one or more circuits that are operable to generate a control voltage for a voltage controlled oscillator, said one or more circuits comprising a filter, a first transmission gate, a second transmission gate that is operable to reset at least a portion of said filter, and at least one clock booster circuit, wherein:
a first of said at least one clock booster circuit is operable to clock said first transmission gate; and
said filter comprises one or more thick oxide transistors to reduce clock feed-through.

13. The system according to claim 12, wherein said first transmission gate comprises an N-type thick oxide transistor and a P-type thick oxide transistor.

14. The system according to claim 13, wherein:
said one or more circuits comprise a sample and hold circuit and said first transmission gate is part of said sample and hold circuit; and
a first terminal of said first transmission gate is communicatively coupled to a first capacitor and a second terminal of said first transmission gate is communicatively coupled to a second capacitor.

15. The system according to claim 14, wherein said one or more circuits comprise a charge pump operable to adjust a voltage at an input node of said sample and hold circuit.

16. The system according to claim 14, wherein said one or more circuits comprise a buffer operable to buffer an output of said sample and hold circuit to generate said control voltage.

17. The system according to claim 16, wherein an input stage of a buffer utilized for said buffering comprises one or more thick oxide transistors.

18. The system according to claim 14, wherein said one or more circuits are operable to control a capacitance of one or both of said first capacitor and said second capacitor such that that a time constant of said sample and hold circuit is within desired limits.

19. The system according to claim 14, wherein said second transmission gate is operable to periodically reset a DC voltage on said input node of said sample and hold circuit.

20. The system according to claim 19, wherein said second transmission gate comprises an N-type thick oxide transistor and a P-type thick oxide transistor.

21. The system according to claim 14, wherein a first terminal of said second transmission gate is communicatively coupled to an input of said sample and hold circuit and a second terminal of said second transmission gate is communicatively coupled to a DC voltage.

22. The system according to claim 20, wherein a second of said at least one clock booster circuits is operable to clock said second transmission gate.

23. A method for signal processing, the method comprising:
  generating, via a filter, a control voltage for controlling a voltage controlled oscillator, wherein:
    said filter comprises at least one switching element clocked via a clock booster circuit;
    said filter comprises one or more thick oxide transistors to reduce clock feed-through;
    a first switching element of said filter is a first transmission gate comprising an N-type thick oxide transistor and a P-type thick oxide transistor;
    said first transmission gate is part of a sample and hold circuit, where a first terminal of said first transmission gate is communicatively coupled to a first capacitor and a second terminal of said first transmission gate is communicatively coupled to a second capacitor;
  periodically resetting a DC voltage on an input node of said sample and hold circuit via a reset switching element, wherein said reset switching element is a second transmission gate comprising an N-type thick oxide transistor and a P-type thick oxide transistor; and
  controlling said voltage controlled oscillator utilizing said generated control voltage.

24. The method according to claim 23, wherein a first terminal of said second transmission gate is communicatively coupled to an input of said sample and hold circuit and a second terminal of said second transmission gate is communicatively coupled to a DC voltage.

25. The method according to claim 23, comprising clocking said second transmission gate via the clock booster circuit.

26. A system for signal processing, the system comprising:
  one or more circuits for generating a control voltage for a voltage controlled oscillator, said one or more circuits comprising a filter, at least one switching element, and at least one clock booster circuit, wherein:
    a first of said at least one clock booster circuit is operable to clock said at least one switching element;
    said filter comprises one or more thick oxide transistors to reduce clock feed-through;
    a first switching element of said filter is a first transmission gate comprising an N-type thick oxide transistor and a P-type thick oxide transistor;
    said one or more circuits comprise a sample and hold circuit and said first transmission gate is part of said sample and hold circuit;
    a first terminal of said first transmission gate is communicatively coupled to a first capacitor and a second terminal of said first transmission gate is communicatively coupled to a second capacitor;
    said one or more circuits comprise a reset switching element, and said reset switching element is operable to periodically reset a DC voltage on an input node of said sample and hold circuit; and
    said reset switching element is a second transmission gate comprising an N-type thick oxide transistor and a P-type thick oxide transistor.

27. The system according to claim 26, wherein a first terminal of said second transmission gate is communicatively coupled to an input of said sample and hold circuit and a second terminal of said second transmission gate is communicatively coupled to the DC voltage.

28. The system according to claim 26, wherein a second of said at least one clock booster circuits is operable to clock said second transmission gate.

* * * * *